United States Patent
Li et al.

(10) Patent No.: US 11,817,880 B2
(45) Date of Patent: Nov. 14, 2023

(54) HAMMING WEIGHT CALCULATION METHOD BASED ON OPERATION APPARATUS

(71) Applicant: HUAWEI TECHNOLOGIES CO., LTD., GuangDong (CN)

(72) Inventors: Yi Li, Wuhan (CN); Jiancong Li, Wuhan (CN); Xiangshui Miao, Wuhan (CN); Peng Yan, Chengdu (CN); Guiyou Pu, Chengdu (CN); Xiaozhong Shi, Chengdu (CN); Keji Huang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/895,466

(22) Filed: Aug. 25, 2022

(65) Prior Publication Data

US 2022/0407540 A1 Dec. 22, 2022

Related U.S. Application Data

(63) Continuation of application No. PCT/CN2021/074765, filed on Feb. 2, 2021.

(30) Foreign Application Priority Data

Feb. 27, 2020 (CN) .......................... 202010128185.X

(51) Int. Cl.
*H03M 13/19* (2006.01)
*H03M 13/00* (2006.01)

(52) U.S. Cl.
CPC ......... *H03M 13/19* (2013.01); *H03M 13/611* (2013.01)

(58) Field of Classification Search
CPC ..... H03M 13/19; H03M 13/611; G06F 7/607; G06F 7/38; G06F 7/405; Y02D 10/00; H04L 9/0863
See application file for complete search history.

(56) References Cited

U.S. PATENT DOCUMENTS

| 8,214,414 B2 | 7/2012 | Ramanarayanan et al. |
| 2006/0015549 A1 | 1/2006 | Chren |

(Continued)

FOREIGN PATENT DOCUMENTS

| CN | 102542334 A | 7/2012 |
| CN | 102820063 A | 12/2012 |

(Continued)

OTHER PUBLICATIONS

NingGe et al., "An efficient analog Hamming distance comparator realized with a unipolar memristor array: a showcase of physical computing", Scientific Reports, Jan. 5, 2017; 7 total pages.

(Continued)

*Primary Examiner* — Thien Nguyen
(74) *Attorney, Agent, or Firm* — Rimon PC

(57) ABSTRACT

The present application discloses a Hamming weight calculation method performed by an operation apparatus. The operation apparatus includes a controller and a first calculator, wherein the controller sets an initial resistance state of the first memory to a low resistance state; determines a first gate voltage of the first transistor based on first bit data in a first binary sequence, and control an on-off state of the first transistor based on the first gate voltage; controls a target resistance state of the first memory based on the on-off state of the first transistor; and determines a Hamming weight of the first bit data based on a first output current on the source of the first transistor.

21 Claims, 5 Drawing Sheets

(56) References Cited

U.S. PATENT DOCUMENTS

| | | | |
|---|---|---|---|
| 2016/0240250 A1 | 8/2016 | Oh et al. | |
| 2017/0346800 A1 | 11/2017 | Katoh | |
| 2018/0102155 A1* | 4/2018 | Tang | H04L 9/0861 |
| 2019/0007063 A1 | 1/2019 | Lien et al. | |
| 2022/0187364 A1* | 6/2022 | Shao | G11C 7/067 |

FOREIGN PATENT DOCUMENTS

| | | |
|---|---|---|
| CN | 107992330 A | 5/2018 |
| CN | 108092658 A | 5/2018 |
| CN | 109509495 A | 3/2019 |
| CN | 109994139 A | 7/2019 |
| CN | 111314075 A | 6/2020 |
| EP | 3125248 A1 | 2/2017 |

OTHER PUBLICATIONS

Zhuo-Rui Wang et al., "Functionally Complete Boolean Logic in 1T1R Resistive Random Access Memory", IEEE Electron Device Letters, vol. 38, No. 2, Feb. 2017; 4 total pages.

Long Cheng et al., "In-Memory Hamming Weight Calculation in a 1T1R Memristive Array", Advanced Electronic Materials, Aug. 6, 2020; 17 total pages.

Zehui Chen et al., "Hamming Distance Computation in Unreliable Resistive Memory", IEEE Transactions on Communications, vol. 66, No. 11, Nov. 2018; 15 total pages (pp. 5013-5027).

Yi Li et al., "Theory and implementation of memory and computation combination based on memristor", National Defense Science and Technology, vol. 37, No. 6, Dec. 2016; 6 total pages.

* cited by examiner

HAMMING WEIGHT CALCULATION METHOD BASED ON OPERATION APPARATUS

CROSS-REFERENCE TO RELATED APPLICATIONS

This application is a continuation of International Application No. PCT/CN2021/074765, filed on Feb. 2, 2021, which claims priority to Chinese Patent Application No. 202010128185.X, filed on Feb. 27, 2020. The disclosures of the aforementioned applications are hereby incorporated by reference in their entireties.

TECHNICAL FIELD

This application relates to the field of digital circuits, and in particular, to a Hamming weight calculation method based on an operation apparatus.

BACKGROUND

In the current information age, coding theory is widely researched and applied. In coding theory, an error tolerance rate of a group of codes often needs to be calculated. In some cases, this means a Hamming weight (HW) of the string of data needs to be calculated. A Hamming weight is a special Hamming distance. As an example, a Hamming weight of a string of data "A" is equal to a Hamming distance between the string of data and an all "0" data string of an equal length, which is, the quantity of "1" contained in the data "A". For example, for data A=00110101, the Hamming weight of A is HW(A)=4.

In addition to playing an important role in coding theory, the Hamming weight of a piece of data needs to be frequently calculated in fields such as digital filtering, piecewise multivariable linear function, binary matrix coverage, Boolean satisfiability, image coloring, and the like. In one method of calculating a Hamming weight in a conventional computer architecture, a 1-bit population count (POPCNT) instruction is introduced at the processor level. However, a large quantity of full-adders and half-adders are required to implement the POPCNT instruction, resulting in a relatively large circuit scale and relatively high power consumption.

SUMMARY

Embodiments of this application provide a Hamming weight calculation method based on an operation apparatus. The operation apparatus based on a one-memory one-transistor (one transistor one resistor, 1T1R) structure does not require a large quantity of full-adders and half-adders, so that a circuit scale is smaller and power consumption is effectively reduced.

According to a first aspect, an operation apparatus provided in an embodiment of this application includes a controller and a first operation unit, the controller is in signal connection with the first operation unit, the first operation unit includes a first memory and a first transistor, a drain of the first transistor is connected to a negative electrode of the first memory, and a source of the first transistor is grounded.

A Hamming weight calculation method is performed by the controller. Specifically, the controller first sets an initial resistance state of the first memory to a low resistance state. Then, the controller adjusts a first gate voltage of the first transistor based on first bit data in a first binary sequence that is taken as input, to control an on-off state of the first transistor. When the first bit data is 0, the first transistor is in an on state; and when the first bit data is 1, the first transistor is in an off state. Next, the controller controls a target resistance state of the first memory based on the on-off state of the first transistor. When the first transistor is in the on state, the target resistance state of the first memory is a high resistance state; and when the first transistor is in the off state, the target resistance state of the first transistor is a low resistance state. Further, the controller determines a Hamming weight of the first bit data based on a first output current at the source of the first transistor.

In this implementation, a Hamming weight of a binary sequence is calculated by using an operation unit based on a 1T1R structure. Specifically, a gate voltage of a transistor is changed based on the binary sequence to control on and off of the transistor, and a resistance state of a memory is changed by adjusting a voltage loaded on the memory, thereby calculating the Hamming weight through cooperation. The operation apparatus based on the 1T1R structure does not require a large quantity of full-adders and half-adders, so that a circuit scale is smaller and power consumption is effectively reduced.

Optionally, in some possible implementations, the operation apparatus further includes a second operation unit, the controller is in signal connection with the second operation unit, the second operation unit includes a second memory and a second transistor, a drain of the second transistor is connected to a negative electrode of the second memory, a source of the second transistor is connected to the source of the first transistor, and a positive electrode of the second memory is connected to a positive electrode of the first memory.

The controller controls the second operation unit to calculate a Hamming weight in a manner similar to that of controlling the first operation unit. Specifically, the controller first sets an initial resistance state of the second memory to a low resistance state. Then, the controller adjusts a second gate voltage of the second transistor based on second bit data in the first binary sequence, to control an on-off state of the second transistor. When the second bit data is 0, the second transistor is in an on state; and when the second bit data is 1, the second transistor is in an off state. Next, the controller controls a target resistance state of the second memory based on the on-off state of the second transistor. When the second transistor is in the on state, the target resistance state of the second memory is a high resistance state; and when the second transistor is in the off state, the target resistance state of the second memory is a low resistance state. Further, the controller determines a Hamming weight of the second bit data based on a second output current at the source of the second transistor.

In this implementation, the operation apparatus may include a plurality of operation units, and each operation unit is configured to calculate a Hamming weight of one piece of bit data in the binary sequence, to calculate a Hamming weight of a string of bit data, thereby improving scalability of this solution.

Optionally, in some possible implementations, the determining a Hamming weight of the first bit data based on an output current on the source of the first transistor includes the following: First, the first transistor is controlled to be turned on. Next, the first output current is obtained by adjusting a voltage loaded on the first memory. Further, the Hamming weight of the first bit data is determined based on the first output current and a preset current.

In this implementation, a specific manner of obtaining the first output current and a specific manner of calculating the Hamming weight based on the first output current are provided, to improve the implementability of this solution.

Optionally, in some possible implementations, the controlling a target resistance state of the first memory based on the on-off state of the first transistor includes: controlling the target resistance state of the first memory by adjusting the voltage loaded on the first memory. It should be noted that when the first transistor is in the on state, a resistance state of the first memory can be adjusted based on a characteristic of the first memory by adjusting the voltage loaded on the first memory. When the first transistor is in the off state, the resistance state of the first memory cannot be changed even if the voltage loaded on the first memory is changed.

Optionally, in some possible implementations, the setting an initial resistance state of the first memory to a low resistance state includes the following: First, the first transistor is controlled to be turned on. Further, the initial resistance state of the first memory is set to the low resistance state by adjusting the voltage loaded on the first memory.

In this implementation, a specific implementation of setting the first memory to the low resistance state is provided, to further improve the implementability of this solution.

Optionally, in some possible implementations, the operation apparatus further includes a third operation unit, the controller is in signal connection with the third operation unit, the third operation unit includes a third memory and a third transistor, a drain of the third transistor is connected to a negative electrode of the third memory, a source of the third transistor is grounded, and a gate of the third transistor is connected to a gate of the first transistor.

The controller controls the third operation unit to calculate a Hamming weight in a manner similar to that of controlling the first operation unit. Specifically, the controller first sets an initial resistance state of the third memory to a low resistance state. Then, the controller adjusts a third gate voltage of the third transistor based on third bit data in a second binary sequence taken as input, to control an on-off state of the third transistor. When the third bit data is 0, the third transistor is in an on state; and when the third bit data is 1, the third transistor is in an off state. Next, the controller controls a target resistance state of the third memory based on the on-off state of the third transistor. When the third transistor is in the on state, the target resistance state of the third memory is a high resistance state; and when the third transistor is in the off state, the target resistance state of the third memory is a low resistance state. Further, the controller determines a Hamming weight of the third bit data based on a third output current on the source of the third transistor.

In this implementation, the first bit data and the second bit data belong to the first binary sequence, and the third bit data belongs to the second binary sequence. The operation apparatus may be an operation unit array including a plurality of rows and a plurality of columns. For example, a plurality of operation units in a first column are configured to calculate a Hamming weight of the first binary sequence, and a plurality of operation units in a second column are configured to calculate a Hamming weight of the second binary sequence. Therefore, based on the operation apparatus the Hamming weights of a plurality of different binary sequences can be sequentially calculated, thereby further improving the scalability of this solution.

Optionally, in some possible implementations, the type of the first memory includes a non-volatile memory, and the type of the first transistor includes a metal-oxide semiconductor field-effect transistor.

According to a second aspect, an embodiment of this application provides a controller, the controller is in signal connection with a first operation unit, the first operation unit includes a first memory and a first transistor, a drain of the first transistor is connected to a negative electrode of the first memory, and a source of the first transistor is grounded; and the controller includes:
  a control unit, configured to set an initial resistance state of the first memory to a low resistance state;
  determine a first gate voltage of the first transistor based on first bit data in a first binary sequence taken as input, and control an on-off state of the first transistor based on the first gate voltage, where when the first bit data is 0, the first transistor is in an on state; and when the first bit data is 1, the first transistor is in an off state; and
  control a target resistance state of the first memory based on the on-off state of the first transistor, where when the first transistor is in the on state, the target resistance state of the first memory is a high resistance state; and when the first transistor is in the off state, the target resistance state of the first memory is a low resistance state; and
  a calculation unit, configured to determine a Hamming weight of the first bit data based on a first output current on the source of the first transistor.

Optionally, in some possible implementations, the controller is further in signal connection with a second operation unit, the second operation unit includes a second memory and a second transistor, a drain of the second transistor is connected to a negative electrode of the second memory, a source of the second transistor is connected to the source of the first transistor, and a positive electrode of the second memory is connected to a positive electrode of the first memory;
  the control unit is further configured to:
  set an initial resistance state of the second memory to a low resistance state;
  determine a second gate voltage of the second transistor based on second bit data in the first binary sequence, and control an on-off state of the second transistor based on the second gate voltage, where when the second bit data is 0, the second transistor is in an on state; and when the second bit data is 1, the second transistor is in an off state; and
  control a target resistance state of the second memory based on the on-off state of the second transistor, where when the second transistor is in the on state, the target resistance state of the second memory is a high resistance state; and when the second transistor is in the off state, the target resistance state of the second memory is a low resistance state; and
  the calculation unit is further configured to determine a Hamming weight of the second bit data based on a second output current on the source of the second transistor.

Optionally, in some possible implementations, the control unit is configured to control the first transistor to be turned on; and
  the calculation unit is configured to:
  obtain the first output current by adjusting a voltage loaded on the first memory; and
  determine the Hamming weight of the first bit data based on the first output current and a preset current.

Optionally, in some possible implementations, the control unit is configured to: control the target resistance state of the first memory by adjusting the voltage loaded on the first memory.

Optionally, in some possible implementations, the control unit is configured to: control the first transistor to be turned on; and
set the initial resistance state of the first memory to the low resistance state by adjusting the voltage loaded on the first memory.

Optionally, in some possible implementations, the controller is further in signal connection with a third operation unit, the third operation unit includes a third memory and a third transistor, a drain of the third transistor is connected to a negative electrode of the third memory, a source of the third transistor is grounded, and a gate of the third transistor is connected to a gate of the first transistor;
the control unit is further configured to:
set an initial resistance state of the third memory to a low resistance state;
determine a third gate voltage of the third transistor based on third bit data in a second binary sequence taken as input, and control an on-off state of the third transistor based on the third gate voltage, where when the third bit data is 0, the third transistor is in an on state; and when the third bit data is 1, the third transistor is in an off state; and
control a target resistance state of the third memory based on the on-off state of the third transistor, where when the third transistor is in the on state, the target resistance state of the third memory is a high resistance state; and when the third transistor is in the off state, the target resistance state of the third memory is a low resistance state; and
the calculation unit is further configured to determine a Hamming weight of the third bit data based on a third output current on the source of the third transistor.

Optionally, in some possible implementations, the type of the first memory includes a non-volatile memory, and the type of the first transistor includes a metal-oxide semiconductor field-effect transistor.

According to a third aspect, an embodiment of this application provides an operation apparatus, including a controller and a first operation unit, where the controller is in signal connection with the first operation unit, the first operation unit includes a first memory and a first transistor, a drain of the first transistor is connected to a negative electrode of the first memory, and a source of the first transistor is grounded;
the controller is configured to set an initial resistance state of the first memory to a low resistance state;
the controller is configured to determine a first gate voltage of the first transistor based on first bit data in a first binary sequence taken as input;
a gate of the first transistor is configured to input the first gate voltage, where when the first bit data is 0, the first transistor is in an on state; and when the first bit data is 1, the first transistor is in an off state;
the controller is configured to control a target resistance state of the first memory based on an on-off state of the first transistor, where when the first transistor is in the on state, the target resistance state of the first memory is a high resistance state; and when the first transistor is in the off state, the target resistance state of the first memory is a low resistance state;
the source of the first transistor is configured to output a first output current; and
the controller is configured to determine a Hamming weight of the first bit data based on the first output current.

Optionally, in some possible implementations, the operation apparatus further includes a second operation unit, the controller is in signal connection with the second operation unit, the second operation unit includes a second memory and a second transistor, a drain of the second transistor is connected to a negative electrode of the second memory, a source of the second transistor is connected to the source of the first transistor, and a positive electrode of the second memory is connected to a positive electrode of the first memory;
the controller is configured to set an initial resistance state of the second memory to a low resistance state;
the controller is configured to determine a second gate voltage of the second transistor based on second bit data in the first binary sequence;
a gate of the second transistor is configured to input the second gate voltage, where when the second bit data is 0, the second transistor is in an on state; and when the second bit data is 1, the second transistor is in an off state;
the controller is configured to control a target resistance state of the second memory based on an on-off state of the second transistor, where when the second transistor is in the on state, the target resistance state of the second memory is a high resistance state; and when the second transistor is in the off state, the target resistance state of the second memory is a low resistance state;
the source of the transistor is configured to output a second output current; and
the controller is configured to determine a Hamming weight of the second bit data based on the second output current.

Optionally, in some possible implementations, the controller is configured to:
control the first transistor to be turned on;
obtain the first output current by adjusting a voltage loaded on the first memory; and
determine the Hamming weight of the first bit data based on the first output current and a preset current.

Optionally, in some possible implementations, the controller is configured to control the target resistance state of the first memory by adjusting the voltage loaded on the first memory.

Optionally, in some possible implementations, the controller is configured to:
control the first transistor to be turned on; and
set the initial resistance state of the first memory to the low resistance state by adjusting the voltage loaded on the first memory.

Optionally, in some possible implementations, the operation apparatus further includes a third operation unit, the controller is in signal connection with the third operation unit, the third operation unit includes a third memory and a third transistor, a drain of the third transistor is connected to a negative electrode of the third memory, a source of the third transistor is grounded, and a gate of the third transistor is connected to a gate of the first transistor;
the controller is configured to set an initial resistance state of the third memory to a low resistance state;
the controller is configured to determine a third gate voltage of the third transistor based on third bit data in a second binary sequence taken as input;
the gate of the third transistor is configured to input the third gate voltage, where when the third bit data is 0, the third transistor is in an on state; and when the third bit data is 1, the third transistor is in an off state;

the controller is configured to control a target resistance state of the third memory based on an on-off state of the third transistor, where when the third transistor is in the on state, the target resistance state of the third memory is a high resistance state; and when the third transistor is in the off state, the target resistance state of the third memory is a low resistance state;

the source of the third transistor is configured to output a third output current; and the controller is configured to determine a Hamming weight of the third bit data based on the third output current.

Optionally, in some possible implementations, a type of the first memory includes a non-volatile memory, and a type of the first transistor includes a metal-oxide semiconductor field-effect transistor.

In the embodiments of this application, a Hamming weight of a binary sequence is calculated by using an operation unit based on a 1T1R structure. Specifically, a gate voltage of a transistor is changed based on the binary sequence to control on and off of the transistor, and a resistance state of a memory is changed by adjusting a voltage loaded on the memory, thereby calculating the Hamming weight through cooperation. The operation apparatus based on the 1T1R structure does not require a large quantity of full-adders and half-adders, so that a circuit scale is smaller and power consumption is effectively reduced.

DESCRIPTION OF EMBODIMENTS

The embodiments of this application provide a Hamming weight calculation method based on an operation apparatus, and an operation apparatus based on a 1T1R structure does not require a large quantity of full-adders and half-adders, so that a circuit scale is smaller and power consumption is effectively reduced. In the specification, claims, and accompanying drawings of this application, the terms "first", "second", "third", "fourth", and so on (if present) are intended to distinguish between similar objects but do not necessarily indicate a specific order or sequence. It should be understood that the data termed in such a way is interchangeable in proper circumstances so that the embodiments described herein can be implemented in other orders than the order illustrated or described herein. Moreover, the terms "include", "contain" and any other variants mean to cover the non-exclusive inclusion, for example, a process, method, system, product, or device that includes a list of steps or units is not necessarily limited to those units, but may include other units not expressly listed or inherent to such a process, method, product, or device.

Figure 1:
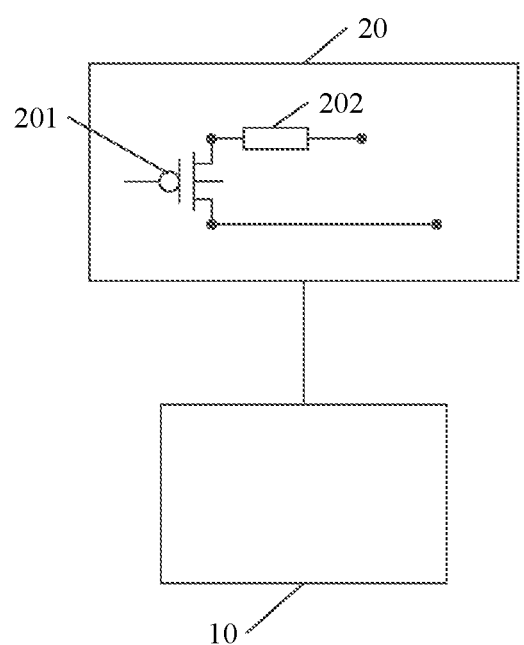
FIG. 1 is a first schematic diagram of a structure of an operation apparatus according to an embodiment of this application.

FIG. 1 is a first schematic diagram of a structure of an operation apparatus according to an embodiment of this application. The operation apparatus includes a controller 10 and a first operation unit 20, and the controller 10 is in signal connection with the first operation unit 20. The following describes a structure of the first operation unit 20. The first operation unit 20 includes a transistor 201 and a memory 202. To be specific, the first operation unit 20 may be implemented by using a 1T1R structure formed by connecting a single transistor 201 and a single memory 202 in series. Specifically, a drain of the transistor 201 is connected to a negative electrode of the memory 202, and a source of the memory 201 is grounded.

Figure 2:
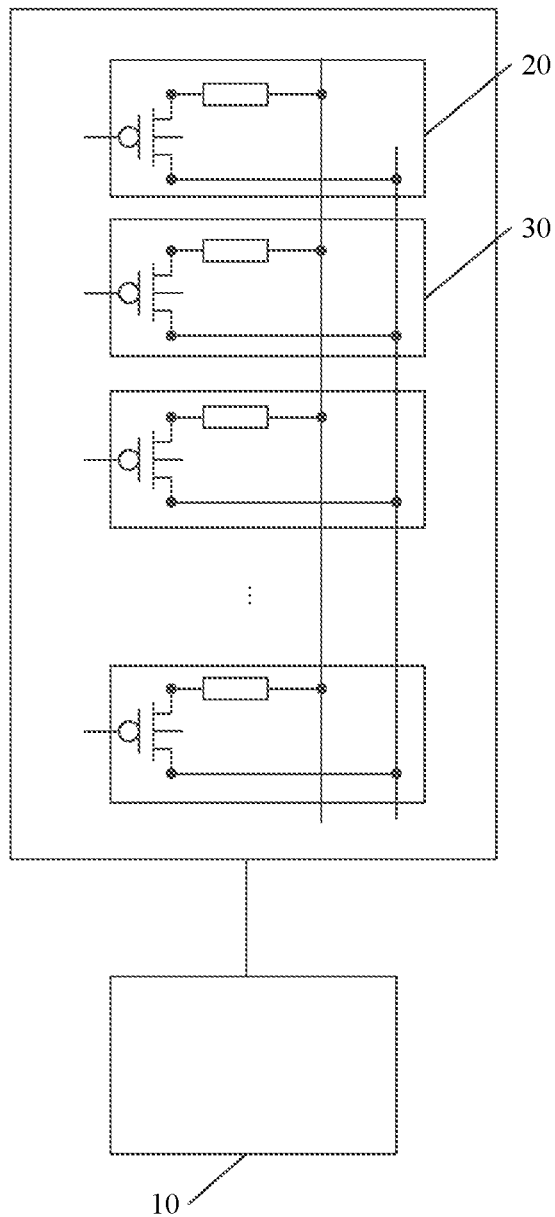
FIG. 2 is a second schematic diagram of a structure of an operation apparatus according to an embodiment of this application.

It should be noted that the first operation unit 20 is configured to calculate a Hamming weight of one bit of bit data in a binary sequence. Therefore, for a binary sequence including a plurality of bits of bit data, a plurality of operation units that have the same structure as the first operation unit 20 are required to calculate a Hamming weight of the binary sequence. FIG. 2 is a second schematic diagram of a structure of an operation apparatus according to an embodiment of this application. The operation apparatus includes a plurality of operation units such as the first operation unit 20 and a second operation unit 30. The controller 10 is in signal connection with each operation unit. Positive electrodes of memories in the operation units are connected to each other. Sources of transistors in the operation units are connected to each other and are grounded. Drains of the transistors are connected to negative electrodes of the memories in the operation units.

Optionally, a type of the memory includes a non-volatile memory, for example, a resistive random memory. A resistance state may be changed under action of different operating voltages, and information is not lost after the voltages are removed. In other words, a resistance state of the memory includes a low resistance state and a high resistance state. The resistive random memory has advantages of a fast operation speed, low power consumption, good size reduction, and compatibility with a complementary metal oxide semiconductor (CMOS), and the like, and has attracted much attention of a semiconductor industry.

Optionally, a type of the transistor includes a metal-oxide semiconductor field-effect transistor (MOSFET). Based on different polarities of a channel (a working carrier) of the MOSFET, the MOSFET may be classified into two types: an "N-type" and a "P-type", which are usually also referred to as an N-MOSFET and a P-MOSFET, and have other abbreviations such as an NMOS and a PMOS. To be specific, a gate voltage and a drain-source voltage that have a positive polarity need to be applied to the NMOS transistor, to make the NMOS transistor different from the PMOS transistor.

It should be noted that, based on a definition of the Hamming weight, the Hamming weight of unknown data or a character string "A" can be calculated by performing a logical "XOR" operation with an all "0" sequence of an equal length. Based on a logical operation characteristic, performing the "XOR" operation with "0" is equivalent to performing an "AND" operation with "1". Therefore, the Hamming weight can be calculated by performing a bitwise "AND" operation on the unknown data or the character string "A".

The Hamming weight calculation method provided in this application is based on a structure of the operation apparatus. The Hamming weight calculation method is performed by the controller 10, and the controller 10 controls the operation units to calculate the Hamming weight. The transistor 201 is turned on and turned off by changing a gate voltage, thereby controlling a series current. A resistance state of the memory 202 is changed under joint control of an externally applied operating voltage and the transistor. Specifically, the gate voltage of the transistor 201 is matched with to-be-measured binary data, for example, binary data "0" and "1" respectively correspond to a turn-on voltage and a zero voltage of the transistor 201. The binary data is also referred to as bit data. The high resistance state and the low resistance state of the memory 202 are respectively matched with logic "0" and "1". When the memory 202 is in the low resistance state, that is, in an "1" state, if input binary data is "0", the transistor 201 is turned on, and a resistance state of the memory 202 is changed to the high resistance state, that is, a "0" state, under action of an externally applied voltage, to complete an operation of 0 AND 1=0. If the input binary data is "1", the transistor 201 is turned off, the resistance state of the memory 202 cannot be changed by the externally applied voltage, and the memory 202 remains in the "1" state, to implement an operation of 1 AND 1=1. A current corresponding to the high resistance state of the memory 202 is far less than a current corresponding to the low resistance state of the memory 202. Therefore, if the memory remains in the low resistance state, an output current on the source of the transistor is approximately equal to a preset low-resistance-state current; and if the memory is changed to the high resistance state, the output current on the source of the transistor is far less than the preset low-resistance-state current. Therefore, the Hamming weight of the binary data can be determined by comparing the output current on the source of the transistor with the preset low-resistance-state current. If the operation is 0 AND 1=0, the Hamming weight is 0; and if the operation is 1 AND 1=1, the Hamming weight is 1. In addition, if a Hamming weight of a binary sequence is calculated, a total output current on the sources of the transistors in the operation units is approximately equal to an integer multiple of the preset low-resistance-state current. If the multiple is n, a decimal system of the Hamming weight of the input binary sequence is represented as n. For example, if the input binary sequence is "00110101", 00110101 AND 1111111=00110101 can be implemented through an operation. For an operation result "00110101", the output current of the sources of the transistors is approximately equal to four times the preset low-resistance-state current. Therefore, an output decimal result is 4, which is exactly a Hamming weight of the input sequence "00110101".

Figure 3:
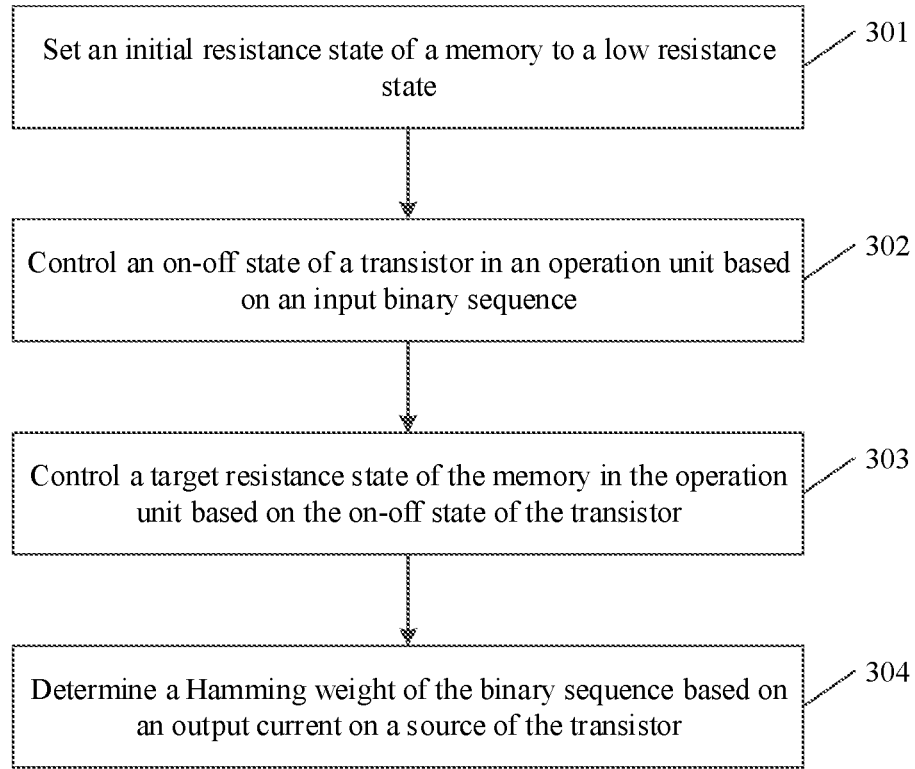
FIG. 3 is a schematic diagram of an embodiment of a Hamming weight calculation method according to this application.

The following describes the Hamming weight calculation method in the embodiments of this application in detail by using the first operation unit 20 as an example. FIG. 3 is a schematic diagram of an embodiment of a Hamming weight calculation method according to this application.

301. Set an initial resistance state of a memory to a low resistance state.

In an embodiment, the initial resistance state of the memory in the operation unit first needs to be set to the low resistance state, that is, a logic "1" state, to subsequently implement an "AND" operation between a binary sequence and "1". Specifically, a transistor in the operation unit is controlled to be turned on, and the initial resistance state of the memory is set to the low resistance state by adjusting a voltage loaded on the memory in the operation unit.

Figure 4:
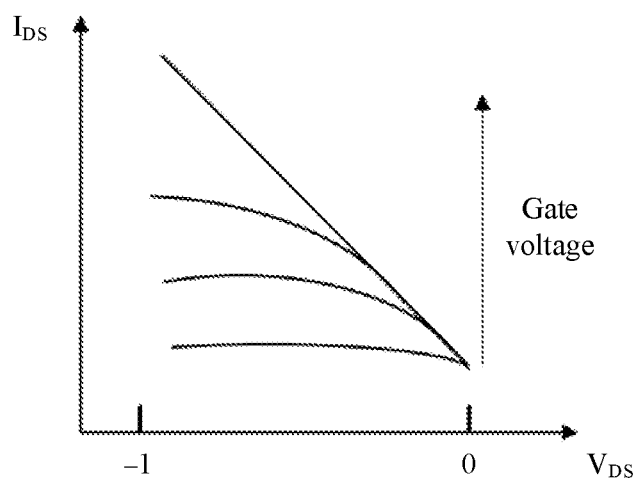
FIG. 4 is a diagram of a correspondence between a source-drain volt-ampere characteristic curve and a gate voltage of a transistor.

It should be noted that on or off of the transistor can be controlled by changing a gate voltage of the transistor. FIG. 4 is a diagram of a correspondence between a source-drain volt-ampere characteristic curve and a gate voltage of a transistor. In FIG. 4, a PMOS transistor is used as an example. When the gate voltage is relatively large and close to zero (which is still a negative value), it is difficult to detect a source-drain current (indicated by a vertical coordinate) even through a source-drain voltage (indicated by a horizontal coordinate) is large, which corresponds to an off state of the transistor. As the gate voltage decreases to a turn-on voltage of the transistor, a relatively large source-drain current can be obtained at a small source-drain voltage, which corresponds to an on state of the transistor. The gate voltage continuously decreases, and the source-drain current is gradually saturated and does not significantly increase. Therefore, on and off of the transistor can be controlled by selecting a proper gate voltage. The gate that causes the transistor to be turned on is referred to as the turn-on voltage of the transistor. It should be noted that different from an NMOS transistor, a turn-on voltage of the PMOS transistor is a negative value, and in a normal working state, a gate voltage of the PMOS transistor is a negative value. When the gate voltage is greater than or equal to 0, the source-drain current of the PMOS transistor is extremely small and cannot be detected. Currently, a turn-on voltage of a commonly used PMOS transistor is −1.5 V. When a turn-on voltage of an actual transistor has a larger value, an actual operating voltage applied to the gate can also be increased accordingly.

Figure 5:
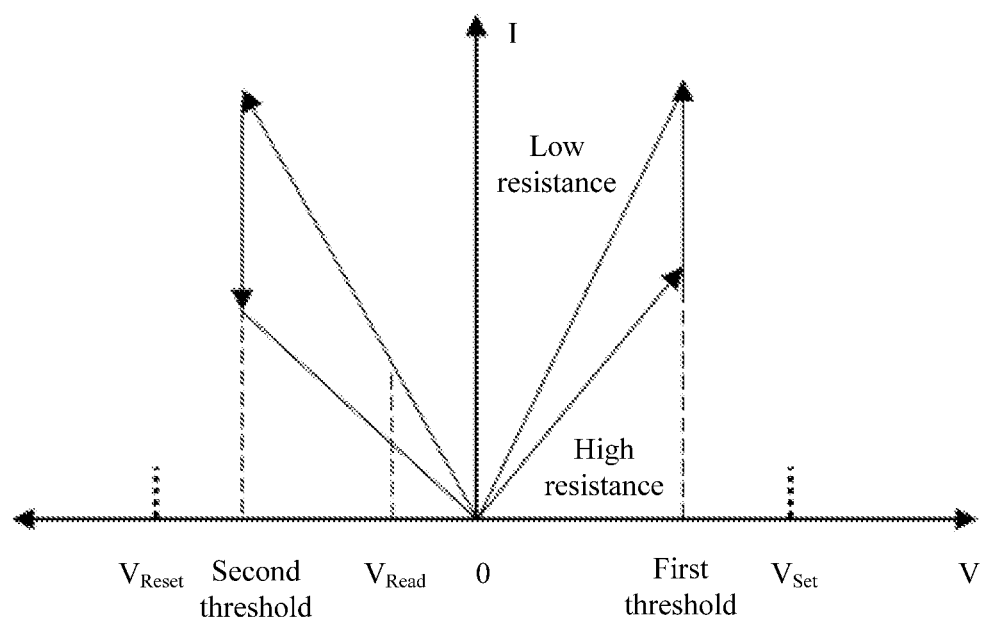
FIG. 5 is a schematic diagram of a volt-ampere characteristic curve of a memory.

The following describes how to adjust a resistance state of the memory by using an example. FIG. 5 is a schematic diagram of a volt-ampere characteristic curve of a memory. It can be learned from FIG. 5 that the memory is a unipolar resistive random memory. A resistance state of the unipolar random memory can be changed at either a positive voltage or a negative voltage. Therefore, a determining factor of a resistance change is not a voltage polarity but an absolute value of a voltage amplitude. When a forward voltage applied to two ends of the memory (for example, at Vset in FIG. 5) is greater than or equal to a first threshold, the memory is changed from a high resistance state to the low resistance state. When a reverse voltage applied to the memory (for example, at Vreset in FIG. 5) is less than or equal to a second threshold, the memory is changed from the low resistance state to the high resistance state. Based on the characteristic of the resistive random memory, the resistance state of the memory can be controlled by controlling the voltage loaded on the memory and combining the on-off characteristics of the transistor.

Optionally, whether the resistance state of the memory in the operation unit is set to the low resistance state can be further determined by obtaining an output current on a source of the transistor. Referring to FIG. 5, after the transistor is turned on, an on-resistance may be ignored. When the voltage loaded on the two ends of the memory is between the first threshold and the second threshold (for example, at Vread in FIG. 5), the output current can be obtained from the source of the transistor. For example, when a memory in a single operation unit is in the low resistance state, an output current of the memory is a known preset current. Therefore, if the obtained output current is the same as the preset current, it indicates that a resistance state of the memory in the operation unit is set to the low resistance state.

It can be understood that the enumerated manner of changing the resistance state of the memory in FIG. 5 is merely an example. In an actual application, the resistance state of the memory may be adjusted in different manners based on an actual characteristic of the memory. This is not specifically limited herein.

302. Control an on-off state of a transistor in the operation unit based on an input binary sequence.

In an embodiment, the controller 10 first obtains an input binary sequence, where each bit in the binary sequence has a corresponding operation unit. For example, the binary sequence has a total of eight bits. In this case, a corresponding operation apparatus also needs to have at least eight corresponding operation units. The first operation unit 20 is configured to calculate a Hamming weight of first bit data, and the second operation unit 30 is configured to calculate a Hamming weight of second bit data. By analogy, a Hamming weight of the 8-bit binary sequence can be calculated in combination with the eight operation units.

Next, the controller 10 can control, based on the input binary sequence, an on-off state of a transistor in each operation unit corresponding to the binary sequence. A transistor in an operation unit corresponding to a bit 0 is in an on state, and a transistor in an operation unit corresponding to a bit 1 is in an off state. Specifically, the controller determines a gate voltage of the transistor based on bit data in the input binary sequence, and controls on and off of the transistor based on the gate voltage. This is similar to the description corresponding to FIG. 4, and details are not described herein.

303. Control a target resistance state of the memory in the operation unit based on the on-off state of the transistor.

In an embodiment, the initial resistance state of the memory is changed to the target resistance state under joint action of an externally applied operating voltage and the transistor. In addition, because on-off states of transistors respectively corresponding to the bit data 0 and 1 are different, the target resistance state may remain the same as the initial resistance state or may be different from the initial resistance state. Specifically, the controller 10 can load a voltage Vreset shown in FIG. 5 on the memory in the operation unit. In this case, if the transistor in the operation unit is in the on state, the memory in the operation unit is changed from the low resistance state to the high resistance state, that is, the target resistance state is the high resistance state. If the transistor in the operation unit is in the off state, the externally applied voltage cannot change the resistance state of the memory, and the memory in the operation unit still remains in the low resistance state, that is, the target resistance state is the low resistance state. A manner of adjusting the resistance state of the memory is similar to the description corresponding to FIG. 5, and details are not described herein.

It should be noted that a process in which the initial resistance state of the memory in the operation unit is changed to the target resistance state is that an "AND" operation is performed between the binary sequence and a full "1" sequence (initial resistance states each are the low resistance state) bit-by-bit, and an output result is the target resistance state of each memory.

304. Determine a Hamming weight of the binary sequence based on an output current on a source of the transistor.

In an embodiment, after the target resistance state of the memory in the operation unit is determined, the Hamming weight of the binary sequence can be determined based on a total output current on the sources of the transistors. Specifically, the transistors in the operation units are first adjusted to the on state. Then, voltages (for example, Vread shown in FIG. 5) on the memories in the operation units are adjusted, to obtain the total output current on the sources of the transistors. Further, the Hamming weight of the binary sequence is determined by comparing the total output current with a preset current. Because an output current of the memory in the low resistance state is much greater than an output current of the memory in the high resistance state, the total output current mainly depends on the current in the low resistance state. When a memory in a single operation unit is in the low resistance state, if an output current of the memory is the known preset current, a multiple of the preset current to the total output current is a Hamming weight result. For example, if the input binary sequence is "00110101", 00110101 AND 1111111=00110101 can be implemented through an operation. For an operation result "00110101", the output current on the sources of the transistors is approximately equal to four times the preset current. Therefore, an output decimal result is 4, which is exactly a Hamming weight of the input sequence "00110101".

Figure 6:
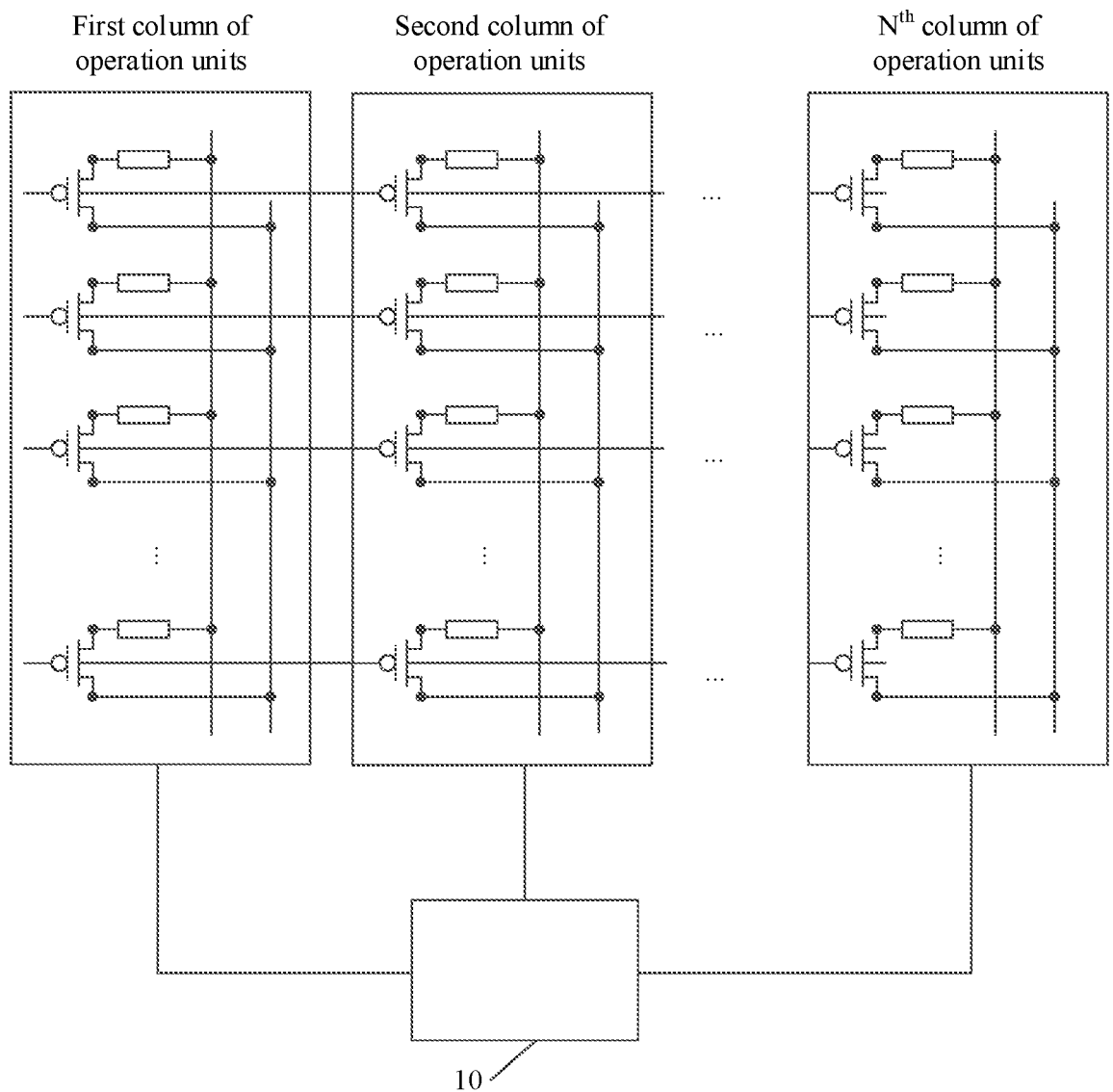
FIG. 6 is a third schematic diagram of a structure of an operation apparatus according to an embodiment of this application.

Optionally, the operation apparatus provided in this application may further calculate Hamming weights of a plurality of binary sequences. FIG. 6 is a third schematic diagram of a structure of an operation apparatus according to an embodiment of this application. The operation apparatus may include a plurality of columns of operation units, and each column of operation units are configured to calculate a Hamming weight of one binary sequence. Gates of transistors in each column of operation units are connected to gates of transistors in another column of operation units at a corresponding position. For example, each column includes 10 sequentially arranged operation units. Therefore, gates of transistors in first operation units in all the columns are connected, gates of transistors in second operation units in all the columns are connected, and so on. When a Hamming weight of a first binary sequence is calculated, the controller controls gate voltages in each row and voltages loaded on memories in the operation units in the first column. When a Hamming weight of a second binary sequence is calculated, the controller controls gate voltages in each row and voltages loaded on memories in the operation units in the second column, and so on. In this way, Hamming weights of a plurality of binary sequences can be sequentially calculated.

It can be understood that the quantity of operation units in each column should be greater than or equal to the quantity of bits in a binary sequence that needs to be calculated. The controller can sequentially control each column of operation units to perform the operations in 301 to 304 to calculate the Hamming weights of the plurality of binary sequences.

In addition, if a binary sequence has a relatively long length and the quantity of bits in the binary sequence is greater than the quantity of operation units in one column, a Hamming weight of the binary sequence can be calculated by using a plurality of columns of operation units. Specifically, the binary sequence is split into a plurality of sequences whose quantity of bits is less than or equal to m (which is the quantity of operation units in each column), and then Hamming weights of the binary sequences obtained after the splitting are calculated by using different columns of operation units. For example, the operation apparatus includes m*n operation units, m=10 and n=10. To be specific, the operation apparatus includes 10 columns of operation units, and each column of operation units includes a total of 10 operation units. If a binary sequence whose quantity of bits is 21 (21>m) is to be calculated, the binary sequence may be sequentially split into three new binary sequences: 10+10+1. Then, three columns of operation units are selected randomly, and three calculation results are sequentially obtained according to the method. Finally, a Hamming weight of the complete 21-bit sequence can be obtained by adding the three calculation results.

In some embodiments of this application, a Hamming weight of a binary sequence is calculated by using an operation unit based on a 1T1R structure. Specifically, a gate voltage of a transistor is changed based on the binary sequence to control on and off of the transistor, and a resistance state of a memory is changed by adjusting a voltage loaded on the memory, thereby calculating the Hamming weight through cooperation. The operation apparatus based on the 1T1R structure does not require a large quantity of full-adders and half-adders, so that a circuit scale is smaller and power consumption is effectively reduced.

The following describes a controller provided in an embodiment of this application.

Figure 7:
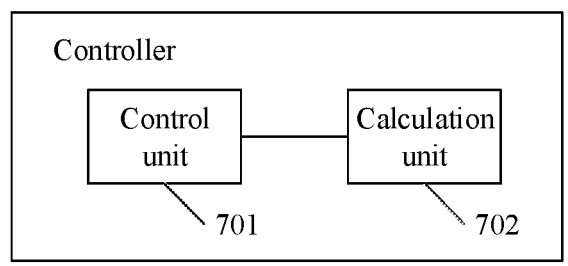
FIG. 7 is a schematic diagram of a structure of a controller according to an embodiment of this application.

FIG. 7 is a schematic diagram of a structure of a controller according to an embodiment of this application. An external part of the controller is in signal connection with one or more operation units. This may be specifically shown in the structure of any operation apparatus in FIG. 1, FIG. 2, and FIG. 6. The operation unit in this embodiment is similar to the operation unit in the embodiments shown in FIG. 1, FIG. 2, and FIG. 6, and details are not described herein. As shown in FIG. 7, the controller includes a control unit 701 and a calculation unit 702 inside. The control unit 701 is configured to perform step 301 to step 303 in the embodiment shown in FIG. 3. The calculation unit 702 is configured to perform step 304 in the embodiment shown in FIG. 3.

It should be understood that, the controller mentioned in the embodiments of this application may be a central processing unit (CPU), or may be another general-purpose processor, a digital signal processor (DSP), an application-specific integrated circuit (ASIC), a field programmable gate array (FPGA), or another programmable logic device, discrete gate or transistor logic device, discrete hardware component, or the like. The general-purpose processor may be a microprocessor, or the processor may be any conventional processor or the like.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this application essentially, or the part contributing to the prior art, or all or some of the technical solutions may be implemented in the form of a software product. The computer software product is stored in a storage medium and includes several instructions for instructing a computer device (which may be a personal computer, a server, or a network device) to perform all or some of the steps of the methods described in the embodiments of this application.

It should be noted that the foregoing embodiments are merely intended for describing the technical solutions of this application, rather than limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A Hamming weight calculation method performed by an operation apparatus, wherein the operation apparatus comprises a controller and a first calculator, the controller is in signal connection with the first calculator, the first calculator comprises a first memory and a first transistor, a drain of the first transistor is connected to a negative electrode of the first memory, and a source of the first transistor is grounded; and the method is performed by the controller, and the method comprises:

setting an initial resistance state of the first memory to a low resistance state;

determining a first gate voltage of the first transistor based on first bit data in a first binary sequence taken as input, and controlling an on-off state of the first transistor based on the first gate voltage, wherein when the first bit data is 0, the first transistor is in an on state; and when the first bit data is 1, the first transistor is in an off state;

controlling a target resistance state of the first memory based on the on-off state of the first transistor, wherein when the first transistor is in the on state, the target resistance state of the first memory is a high resistance state; and when the first transistor is in the off state, the target resistance state of the first memory is the low resistance state; and determining a Hamming weight of the first bit data based on a first output current on the source of the first transistor.

2. The method according to claim 1, wherein the operation apparatus further comprises a second calculator, the controller is in signal connection with the second calculator, the second calculator comprises a second memory and a second transistor, a drain of the second transistor is connected to a negative electrode of the second memory, a source of the second transistor is connected to the source of the first transistor, and a positive electrode of the second memory is connected to a positive electrode of the first memory; and the method further comprises:

setting an initial resistance state of the second memory to a low resistance state;

determining a second gate voltage of the second transistor based on second bit data in the first binary sequence, and controlling an on-off state of the second transistor based on the second gate voltage, wherein when the second bit data is 0, the second transistor is in an on state; and when the second bit data is 1, the second transistor is in an off state;

controlling a target resistance state of the second memory based on the on-off state of the second transistor, wherein when the second transistor is in the on state, the target resistance state of the second memory is a high resistance state; and when the second transistor is in the off state, the target resistance state of the second memory is a low resistance state; and determining a Hamming weight of the second bit data based on a second output current on the source of the second transistor.

3. The method according to claim 1, wherein the determining a Hamming weight of the first bit data based on a first output current on the source of the first transistor comprises:
controlling the first transistor to be turned on;
obtaining the first output current by adjusting a voltage loaded on the first memory; and
determining the Hamming weight of the first bit data based on the first output current and a preset current.

4. The method according to claim 1, wherein the controlling a target resistance state of the first memory based on the on-off state of the first transistor comprises:
controlling the target resistance state of the first memory by adjusting the voltage loaded on the first memory.

5. The method according to claim 1, wherein the setting an initial resistance state of the first memory to a low resistance state comprises:
turning on the first transistor; and
setting the initial resistance state of the first memory to the low resistance state by adjusting the voltage loaded on the first memory.

6. The method according to claim 1, wherein the operation apparatus further comprises a third calculator, the controller is in signal connection with the third calculator, the third calculator comprises a third memory and a third transistor, a drain of the third transistor is connected to a negative electrode of the third memory, a source of the third transistor is grounded, and a gate of the third transistor is connected to a gate of the first transistor; and the method further comprises:
setting an initial resistance state of the third memory to a low resistance state;
determining a third gate voltage of the third transistor based on third bit data in a second binary sequence taken as input, and controlling an on-off state of the third transistor based on the third gate voltage, wherein when the third bit data is 0, the third transistor is in an on state; and when the third bit data is 1, the third transistor is in an off state;
controlling a target resistance state of the third memory based on the on-off state of the third transistor, wherein when the third transistor is in the on state, the target resistance state of the third memory is a high resistance state; and when the third transistor is in the off state, the target resistance state of the third memory is a low resistance state; and
determining a Hamming weight of the third bit data based on a third output current on the source of the third transistor.

7. The method according to claim 1, wherein a type of the first memory comprises non-volatile memory, and a type of the first transistor comprises metal-oxide semiconductor field-effect transistor.

8. A controller, wherein the controller is in signal connection with a first calculator, the first calculator comprises a first memory and a first transistor, a drain of the first transistor is connected to a negative electrode of the first memory, and a source of the first transistor is grounded; and
the controller is configured to set an initial resistance state of the first memory to a low resistance state;
determine a first gate voltage of the first transistor based on first bit data in a first binary sequence taken as input, and control an on-off state of the first transistor based on the first gate voltage, wherein when the first bit data is 0, the first transistor is in an on state, and when the first bit data is 1, the first transistor is in an off state; and
control a target resistance state of the first memory based on the on-off state of the first transistor, wherein when the first transistor is in the on state, the target resistance state of the first memory is a high resistance state, and when the first transistor is in the off state, the target resistance state of the first memory is the low resistance state; and
the controller further comprises a Hamming weight obtainer circuit that is configured to determine a Hamming weight of the first bit data based on a first output current on the source of the first transistor.

9. The controller according to claim 8, wherein the controller is further in signal connection with a second calculator, the second calculator comprises a second memory and a second transistor, a drain of the second transistor is connected to a negative electrode of the second memory, a source of the second transistor is connected to the source of the first transistor, and a positive electrode of the second memory is connected to a positive electrode of the first memory;
the controller is further configured to:
set an initial resistance state of the second memory to a low resistance state;
determine a second gate voltage of the second transistor based on second bit data in the first binary sequence, and control an on-off state of the second transistor based on the second gate voltage, wherein when the second bit data is 0, the second transistor is in an on state, and when the second bit data is 1, the second transistor is in an off state; and
control a target resistance state of the second memory based on the on-off state of the second transistor, wherein when the second transistor is in the on state, the target resistance state of the second memory is a high resistance state, and when the second transistor is in the off state, the target resistance state of the second memory is a low resistance state; and
the Hamming weight obtainer circuit is further configured to determine a Hamming weight of the second bit data based on a second output current on the source of the second transistor.

10. The controller according to claim 8, wherein the controller is configured to turn on the first transistor; and
the Hamming weight obtainer is configured to:
obtain the first output current by adjusting a voltage loaded on the first memory; and
determining the Hamming weight of the first bit data based on the first output current and a preset current.

11. The controller according to claim 8, wherein the controller is configured to control the target resistance state of the first memory by adjusting the voltage loaded on the first memory.

12. The controller according to claim 8, wherein the controller is configured to: control the first transistor to be turned on; and
- set the initial resistance state of the first memory to the low resistance state by adjusting the voltage loaded on the first memory.

13. The controller according to claim 8, wherein the controller is further in signal connection with a third calculator, the third calculator comprises a third memory and a third transistor, a drain of the third transistor is connected to a negative electrode of the third memory, a source of the third transistor is grounded, and a gate of the third transistor is connected to a gate of the first transistor;
- the controller is further configured to:
- set an initial resistance state of the third memory to a low resistance state;
- determine a third gate voltage of the third transistor based on third bit data in a second binary sequence taken as input, and control an on-off state of the third transistor based on the third gate voltage, wherein when the third bit data is 0, the third transistor is in an on state, and when the third bit data is 1, the third transistor is in an off state; and
- control a target resistance state of the third memory based on the on-off state of the third transistor, wherein when the third transistor is in the on state, the target resistance state of the third memory is a high resistance state, and when the third transistor is in the off state, the target resistance state of the third memory is a low resistance state; and
- the Hamming weight obtainer circuit is further configured to determine a Hamming weight of the third bit data based on a third output current on the source of the third transistor.

14. The controller according to claim 8, wherein a type of the first memory comprises non-volatile memory, and a type of the first transistor comprises metal-oxide semiconductor field-effect transistor.

15. An operation apparatus, comprising a controller and a first calculator, wherein the controller is in signal connection with the first calculator, the first calculator comprises a first memory and a first transistor, a drain of the first transistor is connected to a negative electrode of the first memory, and a source of the first transistor is grounded;
- the controller is configured to set an initial resistance state of the first memory to a low resistance state;
- the controller is configured to determine a first gate voltage of the first transistor based on first bit data in a first binary sequence taken as input;
- a gate of the first transistor is configured to input the first gate voltage, wherein when the first bit data is 0, the first transistor is in an on state; and when the first bit data is 1, the first transistor is in an off state;
- the controller is configured to control a target resistance state of the first memory based on an on-off state of the first transistor, wherein when the first transistor is in the on state, the target resistance state of the first memory is a high resistance state; and when the first transistor is in the off state, the target resistance state of the first memory is a low resistance state;
- the source of the first transistor is configured to output a first output current; and
- the controller is configured to determine a Hamming weight of the first bit data based on the first output current.

16. The operation apparatus according to claim 15, wherein the operation apparatus further comprises a second calculator, the controller is in signal connection with the second calculator, the second calculator comprises a second memory and a second transistor, a drain of the second transistor is connected to a negative electrode of the second memory, a source of the second transistor is connected to the source of the first transistor, and a positive electrode of the second memory is connected to a positive electrode of the first memory;
- the controller is configured to set an initial resistance state of the second memory to a low resistance state;
- the controller is configured to determine a second gate voltage of the second transistor based on second bit data in the first binary sequence;
- a gate of the second transistor is configured to input the second gate voltage, wherein when the second bit data is 0, the second transistor is in an on state; and when the second bit data is 1, the second transistor is in an off state;
- the controller is configured to control a target resistance state of the second memory based on an on-off state of the second transistor, wherein when the second transistor is in the on state, the target resistance state of the second memory is a high resistance state; and when the second transistor is in the off state, the target resistance state of the second memory is a low resistance state;
- the source of the second transistor is configured to output a second output current; and
- the controller is configured to determine a Hamming weight of the second bit data based on the second output current.

17. The operation apparatus according to claim 15, wherein the controller is configured to:
- turn on the first transistor;
- obtain the first output current by adjusting a voltage loaded on the first memory; and
- determining the Hamming weight of the first bit data based on the first output current and a preset current.

18. The operation apparatus according to claim 15, wherein the controller is configured to control the target resistance state of the first memory by adjusting the voltage loaded on the first memory.

19. The operation apparatus according to claim 15, wherein the controller is configured to:
- turn on the first transistor; and
- set the initial resistance state of the first memory to the low resistance state by adjusting the voltage loaded on the first memory.

20. The operation apparatus according to claim 15, wherein the operation apparatus further comprises a third calculator, the controller is in signal connection with the third calculator, the third calculator comprises a third memory and a third transistor, a drain of the third transistor is connected to a negative electrode of the third memory, a source of the third transistor is grounded, and a gate of the third transistor is connected to the gate of the first transistor;
- the controller is configured to set an initial resistance state of the third memory to a low resistance state;
- the controller is configured to determine a third gate voltage of the third transistor based on third bit data in a second binary sequence taken as input;
- the gate of the third transistor is configured to input the third gate voltage, wherein when the third bit data is 0, the third transistor is in an on state; and when the third bit data is 1, the third transistor is in an off state;

the controller is configured to control a target resistance state of the third memory based on an on-off state of the third transistor, wherein when the third transistor is in the on state, the target resistance state of the third memory is a high resistance state; and when the third transistor is in the off state, the target resistance state of the third memory is a low resistance state;

the source of the third transistor is configured to output a third output current; and the controller is configured to determine a Hamming weight of the third bit data based on the third output current.

21. The operation apparatus according to claim 15, wherein a type of the first memory comprises non-volatile memory, and a type of the first transistor comprises metal-oxide semiconductor field-effect transistor.

* * * * *